(12) United States Patent
Lu et al.

(10) Patent No.: US 10,892,428 B2
(45) Date of Patent: Jan. 12, 2021

(54) FLEXIBLE SUBSTRATE AND MANUFACTURING METHOD THEREOF

(71) Applicant: Yungu (Gu'an) Technology Co., Ltd., Langfang (CN)

(72) Inventors: Ning Lu, Langfang (CN); Wei Zhang, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 16/524,233

(22) Filed: Jul. 29, 2019

(65) Prior Publication Data

US 2019/0355919 A1    Nov. 21, 2019

Related U.S. Application Data

(63) Continuation of application No. PCT/CN2018/091060, filed on Jun. 13, 2018.

(30) Foreign Application Priority Data

Oct. 31, 2017  (CN) .......................... 2017 1 1051574

(51) Int. Cl.
*H01L 51/00* (2006.01)
*H01L 27/32* (2006.01)
(Continued)

(52) U.S. Cl.
CPC ............ *H01L 51/0097* (2013.01); *B32B 7/12* (2013.01); *B32B 17/06* (2013.01); *B32B 37/12* (2013.01); *B32B 37/18* (2013.01); *G06F 3/041* (2013.01); *H01L 27/323* (2013.01); *H01L 27/3244* (2013.01); *H01L 51/5253* (2013.01); *H01L 51/5281* (2013.01); *H01L 51/56* (2013.01); *B32B 2255/26* (2013.01); *B32B 2255/28* (2013.01); *B32B 2307/202* (2013.01);
(Continued)

(58) Field of Classification Search
CPC ......... B32B 2307/42; H01L 2251/5338; H01L 27/323; H01L 51/0097
See application file for complete search history.

(56) References Cited

U.S. PATENT DOCUMENTS

2018/0101253 A1\* 4/2018 He .......................... C03C 21/002
2019/0193374 A1\* 6/2019 Yamasaki ................ G02B 5/30

FOREIGN PATENT DOCUMENTS

CN    101558131 B    3/2013
CN    203232403 U    10/2013
(Continued)

OTHER PUBLICATIONS

Written Opinion of PCT/CN2018/091060 dated Sep. 10, 2018.
(Continued)

*Primary Examiner* — Daniel P Shook
(74) *Attorney, Agent, or Firm* — Rimon PC

(57) ABSTRACT

A flexible substrate and a manufacturing method thereof are provided according to embodiments of the present application. The flexible substrate includes a hard layer, an organic functional layer and a backplane layer which are stacked. The organic functional layer is attached to the backplane layer. A POL layer and a TP layer are included between the hard layer and the organic functional layer, and the TP layer includes a glass substrate and a conductive layer coated on a surface of the glass substrate.

16 Claims, 7 Drawing Sheets

(51) Int. Cl.

| | | |
|---|---|---|
| *H01L 51/52* | (2006.01) | |
| *H01L 51/56* | (2006.01) | |
| *B32B 7/12* | (2006.01) | |
| *B32B 17/06* | (2006.01) | |
| *B32B 37/12* | (2006.01) | |
| *B32B 37/18* | (2006.01) | |
| *G06F 3/041* | (2006.01) | |

(52) U.S. Cl.
CPC ..... *B32B 2307/42* (2013.01); *B32B 2457/208* (2013.01); *G06F 2203/04102* (2013.01); *G06F 2203/04103* (2013.01); *H01L 2251/5338* (2013.01)

(56) References Cited

FOREIGN PATENT DOCUMENTS

| | | |
|---|---|---|
| CN | 104423693 A | 3/2015 |
| CN | 105122190 A | 12/2015 |
| CN | 205594603 U | 9/2016 |
| CN | 106206652 A | 12/2016 |
| CN | 206209650 U | 5/2017 |
| CN | 107037906 A | 8/2017 |
| CN | 107765921 A | 3/2018 |
| KR | 20130115819 A | 10/2013 |
| TW | 201239419 A | 10/2012 |
| TW | 201311780 A | 3/2013 |
| TW | 201712508 A | 4/2017 |
| TW | 201734162 A | 10/2017 |
| TW | 201737483 A | 10/2017 |

OTHER PUBLICATIONS

Chinese First Office Action for CN Application No. 201711051574.1 dated Jun. 27, 2019.
Chinese Second Office Action for CN Application No. 201711051574.1 dated Apr. 2, 2020.
Lu Bing, ed., et al., Life Electronics, dated Jan. 31, 2015, pp. 161-163, Claims 1-10, Xidian University Press, China.
Taiwan First Office Action for Application No. 107127768 dated Jul. 2, 2019.
PCT International Search Report dated Sep. 10, 2018 in International Application No. PCT/CN2018/091060.

* cited by examiner

FLEXIBLE SUBSTRATE AND MANUFACTURING METHOD THEREOF

CROSS-REFERENCE TO RELATED APPLICATIONS

This application is a continuation of International Application No. PCT/CN2018/091060 filed on Jun. 13, 2018, which claims priority to Chinese patent application No. 201711051574.1 filed on Oct. 31, 2017. Both applications are incorporated herein by reference in their entireties.

TECHNICAL FIELD

Embodiments of the present application relate to the field of display technologies, and particularly to a flexible substrate and a manufacturing method thereof.

BACKGROUND

In order to meet increasingly abundant application needs of users, some existing smart terminals are equipped with super large area display screens. However, the smart terminals equipped with the super large area display screens have problems of inconvenient carrying. For this purpose, some manufacturers began to replace the ordinary display screens on the smart terminals with flexible display screens.

Since the existing flexible substrate is generally formed by a process in which the respective film layers are attached to each other, the screen is thick and the film layers are easily broken during a bending process.

SUMMARY

In view of this, embodiments of the present application provide a flexible substrate and a manufacturing method thereof, so as to solve the problems in the flexible substrate, for example, a screen is thick, the number of film layers is large, and the film layers are easily broken during a bending process.

According to a first aspect, an embodiment of the present application provides a flexible substrate. The flexible substrate includes a hard layer, an organic functional layer and a backplane layer stacked. The organic functional layer is attached to the backplane layer, a Polarizer layer and a Touch Panel layer are disposed between the hard layer and the organic functional layer, and the Touch Panel layer includes a glass substrate and a conductive layer coated on a surface of the glass substrate.

In an embodiment of the present application, the glass substrate of the Touch Panel layer is directly contacted with the organic functional layer.

In an embodiment of the present application, an adhesive layer is disposed between the glass substrate and the organic functional layer.

In an embodiment of the present application, the hard layer includes a hard coating layer disposed in a coating manner, the glass substrate of the Touch Panel layer includes an ultra-thin glass layer, and the adhesive layer includes a pressure-sensitive adhesive layer.

In an embodiment of the present application, the Polarizer layer is disposed on a surface of the glass substrate of the Touch Panel layer without the conductive layer coated.

In an embodiment of the present application, the Polarizer layer includes a Polyvinyl Alcohol layer and a ¼λ slide layer, the ¼ λ slide layer is coated to a surface of the glass substrate of the Touch Panel layer without the conductive layer coated, and the Polyvinyl Alcohol layer is disposed between the glass substrate and the hard layer or between the glass substrate and the organic functional layer.

In an embodiment of the present application, the flexible substrate further includes an adhesive layer disposed between the conductive layer of the Touch Panel layer and the Polyvinyl Alcohol layer of the Polarizer layer.

In an embodiment of the present application, the flexible substrate further includes an adhesive layer disposed between the conductive layer of the Touch Panel layer and the organic functional layer.

In an embodiment of the present application, the flexible substrate further includes an encapsulation layer disposed on a periphery of a film layer included between the glass substrate of the Touch Panel layer and the organic functional layer.

In an embodiment of the present application, the hard layer is disposed in an attaching manner or in a coating manner.

In an embodiment of the present application, a thickness of the glass substrate of the Touch Panel layer is 25 µm to 70 µm.

In an embodiment of the present application, the flexible substrate further includes a first flexible glass layer and a second flexible glass layer, a sealing layer disposed between the first flexible glass layer and the second flexible glass layer, an empty groove region is disposed on central portion of the sealing layer, and the hard layer, the organic functional layer and the backplane layer are disposed in the empty groove region.

In an embodiment of the present application, the flexible substrate further includes a first silicone oil layer disposed adjacent to the first flexible glass layer.

In an embodiment of the present application, the flexible substrate further includes a second silicone oil layer disposed adjacent to the second flexible glass layer.

According to a second aspect, an embodiment of the present application further provides a manufacturing method of a flexible substrate. The manufacturing method includes forming a conductive layer by coating a conductive material on a surface of a glass substrate; disposing a Polarizer layer on a surface of the glass substrate without the conductive material coated; forming a hard layer by performing coating hardening on a surface of the Polarizer layer not contacted with the glass substrate; and stacking the conductive layer, the Polarizer layer and the hard layer with the organic functional layer and the backplane layer which are stacked.

In an embodiment of the present application, a manufacturing method of a flexible substrate further includes preforming an encapsulating operation for a film layer between the glass substrate and the organic functional layer.

In an embodiment of the present application, a manufacturing method of a flexible substrate includes forming a conductive layer by coating a conductive material on a surface of a glass layer; coating a ¼ λ slide layer on another surface of the glass layer without the conductive material coated, and attaching a Polyvinyl Alcohol layer and the conductive layer; forming a hard layer by performing coating hardening on a surface of the Polyvinyl Alcohol layer not contacted with the glass layer; and stacking the conductive layer, the Polyvinyl Alcohol layer and the hard layer with the organic functional layer and the backplane layer which are stacked.

In an embodiment of the present application, a manufacturing method of a flexible substrate further includes preforming an encapsulating operation for a film layer between the glass layer and the organic functional layer.

In the flexible substrate according to the embodiments of the present application, the glass substrate is disposed, and a conductive material is coated on the glass substrate by a coating progress to form the conductive layer, and the glass substrate coated with the conductive layer is stacked with other film layers to form the flexible substrate. Therefore, a thickness and the number of layers of the flexible substrate are reduced while possibility of fracture of the film layers during a bending process is finally reduced.

DETAILED DESCRIPTION

In order to make purposes, technical means and advantages of the present application more comprehensible, the present application will be further described in detail below with reference to accompanying drawings.

Figure 1:
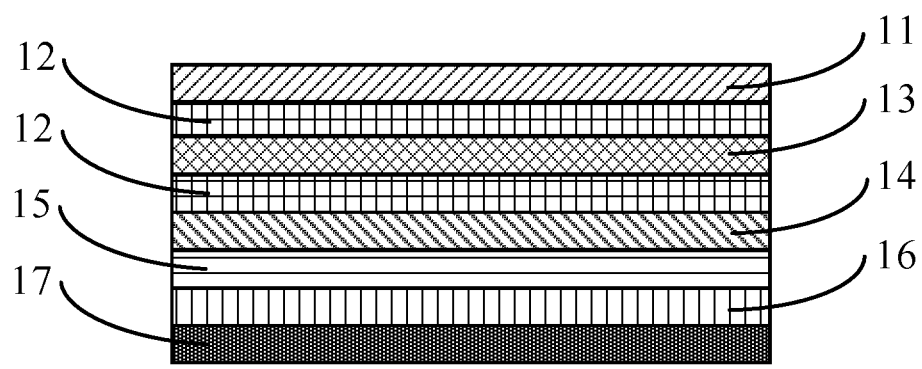
FIG. 1 is a schematic structural diagram of a flexible substrate.

FIG. 1 is a schematic structural diagram of a flexible substrate. As shown in FIG. 1, the flexible substrate includes a cover plate 11, an Optically Clear Adhesive (OCA) layer 12, a Touch Panel (TP) layer 13, an Optically Clear Adhesive (OCA) layer 12, a Polarizer (POL) layer 14, a Thin Film Encapsulation (TFE) layer 15, an Organic Light Emitting Diode (OLED) layer 16 and a backplane film layer 17. The cover plate 11 having a function of protecting the screen in the flexible substrate is made of Polyimide (PI) or Polyethylene Terephthalate (PET). Therefore, Indium Tin Oxide (ITO) (conductive material) may only be attached in a form of the TP layer 13, and may not be set by a thinner coating process.

In the flexible substrate, an approximate thickness of each film layer is as follows. A thickness of the cover plate 11 is 150 µm, a thickness of the OCA layer 12 is 25 µm, a thickness of the TP layer 13 is 50 µm, a thickness of the POL layer 14 is 75 µm, a thickness of the TFE layer 15 is 15 µm, a thickness of the OLED layer 16 is 20 µm, and a thickness of the backplane film layer 17 is 100 µm. That is, the overall thickness of the existing flexible substrate is approximately 460 µm.

Figure 2:
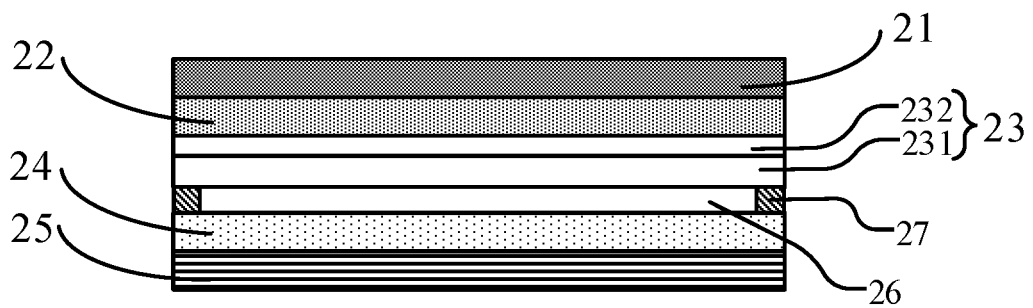
FIG. 2 is a schematic structural diagram of a flexible substrate according to a first embodiment of the present application.

FIG. 2 is a schematic structural diagram of a flexible substrate according to a first embodiment of the present application. As shown in FIG. 2, the flexible substrate according to the first embodiment of the present application includes a hard layer 21, a POL layer 22, a TP layer 23, an organic functional layer 24 and a backplane layer 25 sequentially stacked from top to bottom. The TP layer 23 includes a glass substrate 231 and a conductive layer 232 coated on a surface of the glass substrate 231.

Specific implementation includes the following two cases.

In a first case, the conductive layer 232 of the TP layer 23 is coated on an upper surface of the glass substrate 231 (the upper surface is an upper surface along a stacking direction shown in FIG. 2). At this time, the glass substrate 231 of the TP layer 23 is directly contacted with the organic functional layer 24.

The glass substrate 231 and the organic functional layer 24 directly contacted with the glass substrate 231 need to be bonded and fixed by an adhesive layer 26. In addition, in order to sufficiently block destruction of the organic functional layer 24 by substances such as moisture and oxygen from the outside, it is necessary to perform an encapsulating operation on a periphery of the adhesive layer 26 between the glass substrate 231 and the organic functional layer 24 to form an encapsulation layer 27. The encapsulation layer 27 is disposed along the periphery of the adhesive layer 26 that is not contacted with other film layers of the flexible substrate.

In a second case, the conductive layer 232 of the TP layer 23 is coated on a lower surface of the glass substrate 231 (the lower surface is a lower surface along the stacking direction shown in FIG. 2). At this time, the conductive layer 232 coated on the glass substrate 231 is disposed between the glass substrate 231 of the TP layer 23 and the organic functional layer 24. In addition, an adhesive layer 26 may be further included between the TP layer 23 and the organic functional layer 24. That is, the adhesive layer 26 is disposed between the conductive layer 232 and the organic functional layer 24. An encapsulating operation is performed on the conductive layer 232 and the adhesive layer 26 to form an encapsulation layer 27. The encapsulation layer 27 is disposed along peripheries of the conductive layer 232 and the adhesive layer 26 that are not contacted with other film layers of the flexible substrate, so as to sufficiently block destruction of the organic functional layer 24 by substances such as moisture and oxygen from the outside.

In the second case of the specific implementation of the embodiment of the present application, the adhesive layer 26 is disposed between the conductive layer 232 of the TP layer 23 and the organic functional layer 24 for strong bonding. Therefore, stability of the flexible substrate is improved according to the embodiment of the present application.

The organic functional layer 24 may be either an OLED layer or a film layer having other functions.

In addition, the backplane layer 25 may be either a backplane film layer in a conventional screen or a backplane layer integrated with other functions.

In the flexible substrate according to the first embodiment of the present application, the glass substrate is disposed, and a conductive material is coated on the glass substrate by a coating progress to form the conductive layer, and the glass substrate coated with the conductive layer is stacked with other film layers to form the flexible substrate. Therefore, a thickness and the number of layers of the flexible substrate are reduced while possibility of fracture of the film layers during a bending process is finally reduced.

In an embodiment of the present application, the hard layer is disposed in an attachment manner. That is, the hard layer is attached to an adjacent film layer in a form of a cover plate. Therefore, adaptability of the flexible substrate is improved according to the embodiment of the present application.

In an embodiment of the present application, the hard layer is disposed in a coating manner. That is, the hard layer is coated to an adjacent film layer in the coating manner. Compared with the attachment manner, a thickness of the hard layer may be reduced by the coating manner. Thereby the probability of the fracture of the film layers during the bending process may be further reduced.

In an embodiment of the present application, the POL layer 22 of the flexible substrate is disposed on a surface of the glass substrate 231 of the TP layer without the conductive layer 232 coated. That is, the POL layer 22 and the conductive layer 232 are respectively disposed on opposite surfaces of the glass substrate 231 by the glass substrate 231. Thereby, the glass substrate, the hard layer and the organic functional layer also respectively disposed on the opposite surfaces of the glass substrate 231 together form effective protection for the POL layer 22 and/or the conductive layer 232.

Figure 3:
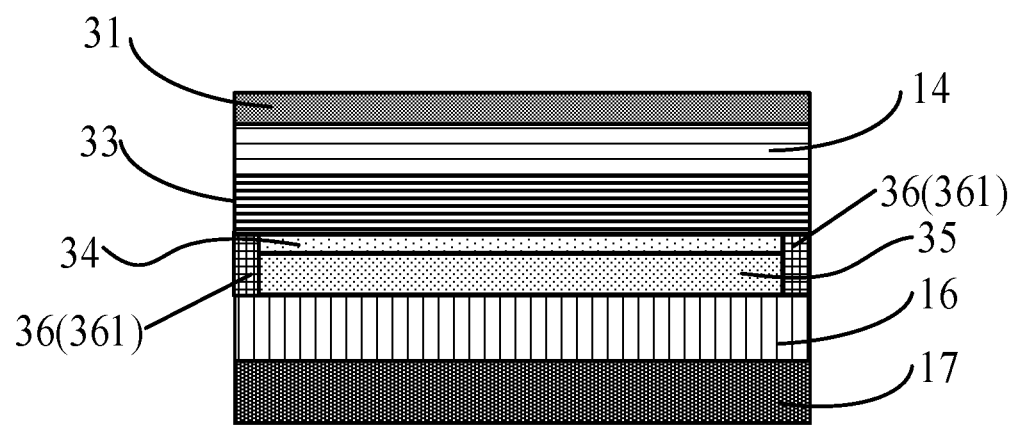
FIG. 3 is a schematic structural diagram of a flexible substrate according to a second embodiment of the present application.

FIG. 3 is a schematic structural diagram of a flexible substrate according to a second embodiment of the present application. The second embodiment of the present application is extended on the basis of the first embodiment of the present application. The second embodiment of the present application is substantially the same as the first embodiment of the present application. Differences will be described below, and similarities are not described again.

As shown in FIG. 3, the flexible substrate according to the second embodiment of the present application includes a hard coating layer 31, a POL layer 14, an ultra-thin glass layer 33, an ITO (conductive material) layer 34, a pressure-sensitive adhesive layer 35, an OLED layer 16, a backplane film layer 17 and a moisture-oxygen barrier rubber layer 36 sequentially stacked from top to bottom. The moisture-oxygen barrier rubber layer 36 is disposed along peripheries of the ITO layer 34 and the pressure-sensitive adhesive layer 35 that are not contacted with other film layers of the flexible substrate.

In the flexible substrate according to the second embodiment of the present application, the moisture-oxygen barrier rubber layer 36 (i.e., an encapsulation layer 361) is disposed to block destruction of the OLED layer 16 by substances such as moisture and oxygen from the outside.

In an embodiment of the present application, an ultra-thin glass in the ultra-thin glass layer 33 is an ultra-thin glass having a thickness of 70 µm and a bending radius of 3 mm to 5 mm. Therefore, a thickness of the flexible substrate according to the embodiment of the present application is reduced.

In another embodiment of the present application, the ultra-thin glass in the ultra-thin glass layer 33 is an ultra-thin glass having a thickness of 50 µm and a bending radius of 3 mm to 5 mm. Therefore, the thickness of the flexible substrate according to the embodiment of the present application is further reduced.

In another embodiment of the present application, the ultra-thin glass in the ultra-thin glass layer 33 is an ultra-thin glass having a thickness of 25 µm and a bending radius of 3 mm to 5 mm. Therefore, the thickness of the flexible substrate according to the embodiment of the present application is further reduced.

An approximate thickness of each film layer of the flexible substrate according to the second embodiment of the present application is as follows. A thickness of the hard coating layer 31 is 10 µm. A thickness of the POL layer 14 is 75 µm. A thickness of the ultra-thin glass layer 33 is 70 µm or 50 µm. A thickness of the ITO layer 34 is 5 µm. A thickness of the pressure-sensitive adhesive layer 35 is 7 µm. A thickness of the OLED layer 16 is 20 µm, and a thickness of the backplane film layer 17 is 100 µm. That is, an overall thickness of the flexible substrate according to the second embodiment of the present application is approximately 287 µm (when the thickness of the ultra-thin glass layer 33 is 70 µm) or 267 µm (when the thickness of the ultra-thin glass layer 33 is 50 µm).

In the flexible substrate according to the second embodiment of the present application, the hard layer 21 of the flexible substrate mentioned in the first embodiment is replaced with the hard coating layer 31 disposed in the coating manner, the glass substrate of the TP layer 23 is replaced with the ultra-thin glass layer 33, and the adhesive layer is replaced with the pressure-sensitive adhesive layer 35. Therefore, the overall thickness and the number of layers of the flexible substrate are reduced while surface hardness of the screen is ensured. Moreover, fracture of the film layers is effectively avoided, and bending reliability of the flexible substrate is improved.

Figure 4:
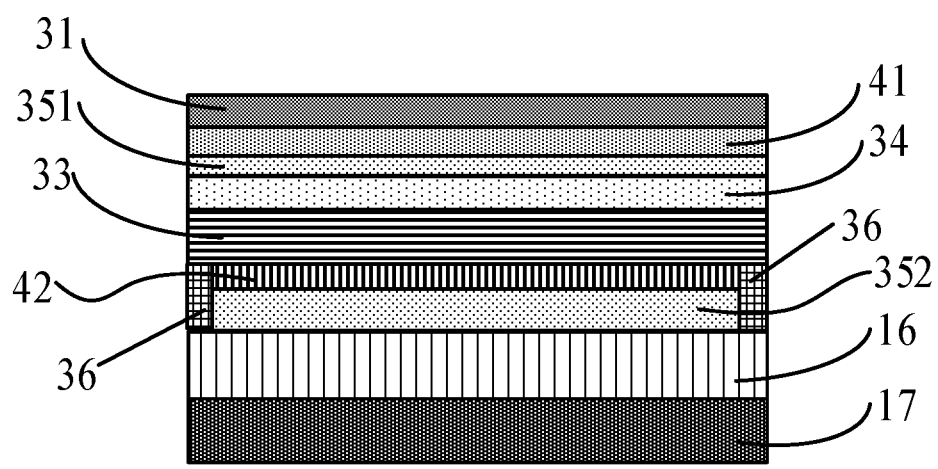
FIG. 4 is a schematic structural diagram of a flexible substrate according to a third embodiment of the present application.

FIG. 4 is a schematic structural diagram of a flexible substrate according to a third embodiment of the present application. The third embodiment of the present application is extended on the basis of the second embodiment of the present application. The third embodiment of the present application is substantially the same as the second embodiment of the present application. Differences will be described below, and similarities are not described again.

As shown in FIG. 4, in the flexible substrate according to the third embodiment of the present application, the POL layer 14 of the flexible substrate mentioned in the second embodiment is replaced with a Polyvinyl Alcohol (PVA) layer 41 and a ¼λ slide layer 42. Specifically, the flexible substrate according to the third embodiment of the present application includes a hard coating layer 31, the PVA layer 41, a first pressure-sensitive adhesive layer 351, an ITO layer 34, an ultra-thin glass layer 33, the ¼λ slide layer 42, a second pressure-sensitive adhesive layer 352, an OLED layer 16 and a backplane film layer 17 sequentially stacked from top to bottom. The flexible substrate according to the third embodiment of the present application further includes a moisture-oxygen barrier rubber layer 36. The ¼λ slide layer 42 and the pressure-sensitive adhesive layer 35 are disposed between the ultra-thin glass layer 33 and the OLED layer 16. The moisture-oxygen barrier rubber layer 36 is disposed along peripheries of the ¼ λ slide layer 42 and the second pressure-sensitive adhesive layer 352 that are not contacted with other film layers of the flexible substrate. Therefore, the moisture-oxygen barrier rubber layer 36 (i.e., an encapsulation layer 361) is disposed to block destruction of the OLED layer 16 by substances such as moisture and oxygen from the outside.

An approximate thickness of each film layer of the flexible substrate according to the third embodiment of the present application is as follows. A thickness of the hard coating layer 31 is 10 μm. A thickness of the PVA layer 41 is 12 μm. Thicknesses of the first pressure-sensitive adhesive layer 351 and the second pressure-sensitive adhesive layer 352 are 7 μm. A thickness of the ITO layer 34 is 5 μm. A a thickness of the ultra-thin glass layer 33 is 70 μm or 50 μm. A thickness of the ¼λ slide layer 42 is 5 μm. A thickness of the OLED layer 16 is 20 μm, and a thickness of the backplane film layer 17 is 100 μm. That is, an overall thickness of the flexible substrate according to the third embodiment of the present application is approximately 236 μm (when the thickness of the ultra-thin glass layer 33 is 70 μm) or 216 μm (when the thickness of the ultra-thin glass layer 33 is 50 μm).

In the flexible substrate according to the third embodiment of the present application, the POL layer 14 of the flexible substrate according to the second embodiment is replaced with the PVA layer 41 and the ¼λ slide layer 42. Therefore, the overall thickness of the flexible substrate is further reduced while functions of the respective layers of the flexible substrate are retained. Since the ¼λ slide layer 42 is also disposed on the ultra-thin glass layer 33 in a coating manner, a separation phenomenon of the film layers of the flexible substrate during a bending process may be obviously improved according to the third embodiment of the present application.

In the third embodiment of the present application, an adhesive layer (i.e., the first pressure-sensitive adhesive layer 351) is disposed between a conductive layer (i.e., the ITO layer 34) of the TP layer and the PVA layer 41 of the POL layer 14. Therefore, effective fixing between the film layers of the flexible substrate may be realized, and stability of the flexible substrate may be further improved according to the embodiments of the present application.

In an embodiment of the present application, the PVA layer 41 and the ¼λ slide layer 42 may also be disposed on a same side of the ultra-thin glass layer 33. Therefore, adaptability of the flexible substrate may be substantially improved according to the embodiment of the present application. For example, the ITO layer 34 is coated on a surface of the ultra-thin glass layer 33 near the hard coating layer 31, and the PVA layer 41 and the ¼λ slide layer 42 are both disposed between the ultra-thin glass layer 33 and the OLED layer 16. Meanwhile, the PVA layer 41 and the ¼λ slide layer 42 are bonded by the second pressure-sensitive adhesive layer 352 and encapsulated by the moisture-oxygen barrier rubber layer 36. For another example, the PVA layer 41 and the ¼ λ slide layer 42 are both disposed between the hard coating layer 31 and the ultra-thin glass layer 33, and the ITO layer 34 is coated on a surface of the ultra-thin glass layer 33 near the OLED layer 16.

In the flexible substrate mentioned in the above embodiments of the present application, the hard coating layer 31 may be replaced with the cover plate 11 in the existing flexible substrate. Therefore, adaptability of the flexible substrate may be improved according to the above embodiments of the present application. Compared with the flexible substrate in the prior art, technical effects of reducing the thickness of the flexible substrate and reducing fracture of film layers during a bending process may be achieved according to the replaced flexible substrate.

In addition, in the flexible substrate mentioned in the above embodiments of the present application, one or both of the first pressure-sensitive adhesive layer 351 and the second pressure-sensitive adhesive layer 352 may be replaced with the OCA layer 12 in the existing flexible substrate. Therefore, the adaptability of the flexible substrate may be improved according to the above embodiments of the present application. Compared with the flexible substrate in the prior art, the technical effects of reducing the thickness of the flexible substrate and reducing the fracture of the film layers during the bending process may be achieved according to the replaced flexible substrate.

Figure 5:
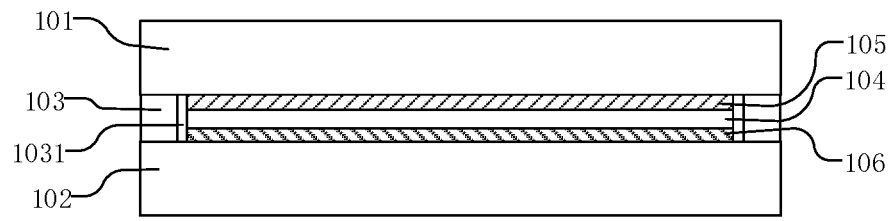
FIG. 5 is a schematic structural diagram of a flexible substrate according to a fourth embodiment of the present application.

FIG. 5 is a schematic structural diagram of a flexible substrate according to a fourth embodiment of the present application. As shown in FIG. 5, the flexible substrate includes a first flexible glass layer 101 and a second flexible glass layer 102 stacked on the first flexible glass layer 101, a sealing layer 103 disposed between the first flexible glass layer 101 and the second flexible glass layer 102, and a display panel 104. An empty groove region 1031 is disposed on central portion of the sealing layer 103. The display panel 104 is disposed in the empty groove region 1031 of the sealing layer 103. A bottom surface area size of the empty groove region 1031 is larger than that of the display panel 104. The display panel 104 includes a POL layer, a TP layer and an organic functional layer.

Flexible glass has a bendable property. Flexible glass may withstand 100,000 bending fatigue tests with bending radii of 5 mm. When glass is thin to a certain extent, softness of glass is exhibited. Therefore, glass may be bent without breaking. Ultra-thin flexible glass has properties of glass such as hardness, transparency, heat resistance, electrical insulation, gas impermeability, and has relatively stable mechanical and chemical properties in an oxidizing and illuminating environment, and is bendable and lightweight. Specific thicknesses of the first flexible glass layer 101 and the second flexible glass layer 102 are not limited in the embodiment of the present application.

It may be seen that the hard layer and the backplane layer of the flexible substrate may be replaced with the flexible glass layers. Since flexible glass itself has excellent stiffness and bending resistance, a problem that the existing flexible substrate has a demand contradiction between the stiffness and prevention of fracture of film layers may be effectively solved. Meanwhile, the display panel 104 is disposed in the empty groove region 1031 between the first flexible glass layer 101 and the second flexible glass layer 102, and the bottom surface area size of the empty groove region 1031 is larger than that of the display panel 104. When the display panel 104 is bent, the display panel 104 may slide relative to the first flexible glass layer 101 and the second flexible glass layer 102 in the empty groove region 1031. Thereby, bending stress may be alleviated, and a separation phenomenon of the film layers of the display panel 104 may be effectively avoided, and bending resistance of the flexible substrate may be further improved, and reliability of products may be improved.

A specific shape of the empty groove region 1031 of the sealing layer 103 may be adjusted according to a shape of the display panel 104. Generally speaking, the empty groove region 1031 only needs to be slightly larger than the display panel 104 and have the same shape as the display panel 104. For example, when the display panel 104 has a rectangular shape, the empty groove region 1031 of the sealing layer 103 may also have a rectangular shape. However, the bottom surface area size of the empty groove region 1031 is larger than that of the display panel 104, so that the display panel 104 may be facilitated to slide in the empty groove region 1031 during the bending process. The specific shape of the empty groove region 1031 of the sealing layer 103 is not limited in the present application.

In an embodiment of the present application, in order to make sliding of the display panel 104 in the empty groove region 1031 more flexible and smooth during the bending process, a first silicone oil layer 105 may be disposed between the display panel 104 and the first flexible glass layer 101, and/or a second silicone oil layer 106 may be disposed between the display panel 104 and the second flexible glass layer 102. However, even if there is no the first silicone oil layer 105 and the second silicone oil layer 106, the display panel 104 may also slide in the empty groove region 1031. Whether the flexible substrate includes the first silicone oil layer 105 and the second silicone oil layer 106 is not limited in the present application.

In an embodiment of the present application, the sealing layer 103 is bonded to the first flexible glass layer 101 and/or the second flexible glass layer 102 by an adhesive layer. A material of the adhesive layer may be transparent OCA. However, the specific material of the adhesive layer is not limited in the present application.

In an embodiment of the application, the sealing layer 103 may be made of silicone rubber. Silicone rubber material may be elastically deformed with a change of bending stress, and has good bending resistance and sealing performance. However, the sealing layer 103 may also be made of other sealing materials, and the specific material of the sealing layer 103 is not limited in the present application.

Figure 6:
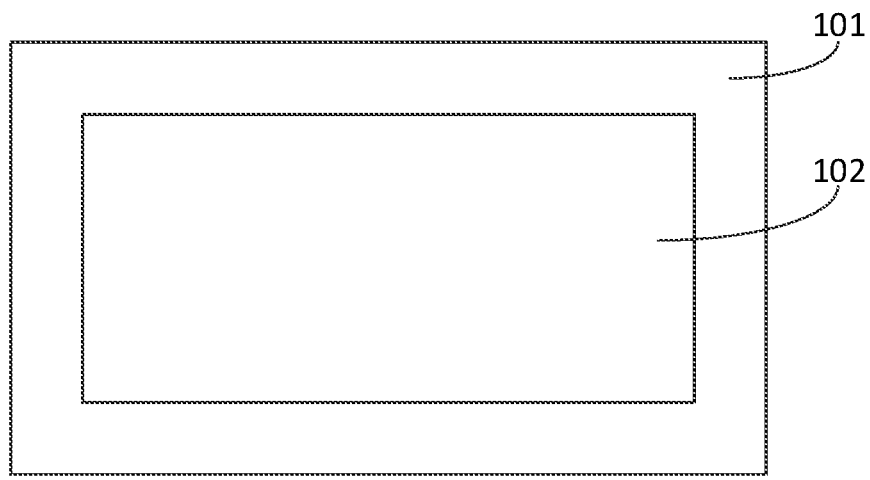
FIG. 6 is a schematic top view diagram of a flexible substrate according to a fifth embodiment of the present application.
Figure 7:
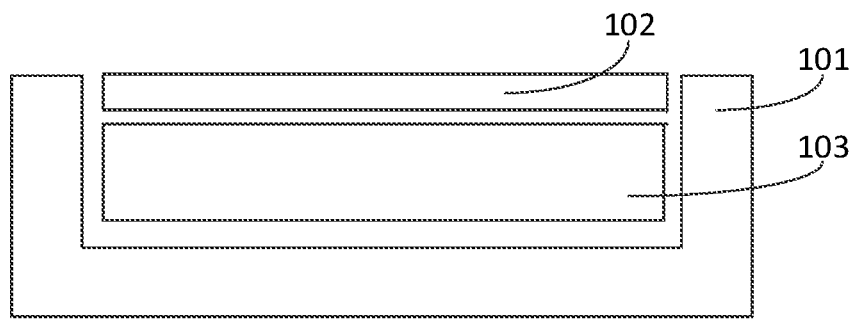
FIG. 7 is a schematic front view diagram of the flexible substrate according to the fifth embodiment of the present application.
Figure 8:
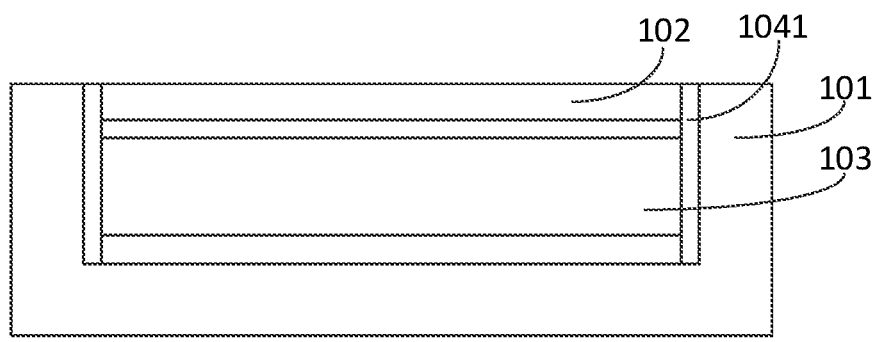
FIG. 8 is a schematic structural diagram of a flexible substrate according to a sixth embodiment of the present application.

FIG. 6 and FIG. 7 are respectively a schematic top view diagram and a schematic front view diagram of a flexible substrate according to a fifth embodiment of the present application. FIG. 8 is a schematic structural diagram of a flexible substrate according to a sixth embodiment of the present application. As shown in FIG. 6 to FIG. 8, the flexible substrate includes a flexible glass layer and a display panel disposed inside the flexible glass layer.

The flexible glass layer includes a first flexible glass layer 101 having a groove in central portion and a second flexible glass layer 102. The first flexible glass layer 101 having the groove in the central portion may be prepared by grooving in the central portion of a piece of flexible glass by an etching method and so on.

The first flexible glass layer 101 having the groove in the central portion may be prepared or directly purchased from a glass sales company. The groove may be prepared by a process such as etching. The source or preparation manner of the first flexible glass layer 101 having the groove in the central portion is not limited in the present application.

The display panel is disposed within the groove of the first flexible glass layer 101. The display panel may be disposed in the groove of the first flexible glass layer 101 in a bonding manner using OCA. A sliding range of the second flexible glass layer 102 may be effectively limited by the groove of the first flexible glass layer 101. Therefore, an excessive positional displacement of the second flexible glass layer 102 during bending may be prevented to cause failure of the whole flexible substrate.

The second flexible glass layer 102 is disposed on the display panel, and the second flexible glass layer 102 is bonded to the display panel by OCA. An upper surface of the second flexible glass layer 102 and an upper surface of the first flexible glass layer 101 may be kept at the same horizontal plane. In an embodiment of the application, a cross-sectional area of the groove of the first flexible glass layer 101 having the groove in the middle is larger than a cross-sectional area of the display panel. Thus, during the bending process of the flexible substrate, the display panel may slide in the groove. Therefore, the bending stress may be further dispersed to avoid the fracture and the failure of the display panel. And the second flexible glass layer 102 may be located in the groove of the first flexible glass layer 101. Therefore, the sliding and the positional displacement of the second flexible glass layer 102 may be effectively suppressed by the first flexible glass layer 101, and the bending resistance of the flexible substrate is improved.

The display panel is disposed in the groove of the first flexible glass layer 101 by OCA bonding or by silicone oil bonding and so on. When bonded by silicone oil, the display panel may slide better in the groove to alleviate the bending stress. The specific setting method and specific bonding material are not limited in the present application.

In an embodiment of the present application, an periphery of the second flexible glass layer 102 and a side surface of the groove of the first flexible glass layer 101 are encapsulated by a laser sintered glass powder process. An encapsulated glass powder layer 1041 is shown in FIG. 8. A gap between the periphery of the second flexible glass layer 102 and the side surface of the groove of the first flexible glass layer 101 may be filled with the laser sintered glass powder layer 1041. External moisture and oxygen may be prevented from entering the inside of the display panel. The upper surface of the display panel after the encapsulation is covered with the second flexible glass layer 102. The lower surface and the side surface of the display panel are covered with the first flexible glass layer 101. The display panel is surrounded by the glass powder layer 1041. Therefore, moisture and oxygen may be effectively blocked, and the property blocking moisture and oxygen of the flexible substrate may be improved.

Figure 9:
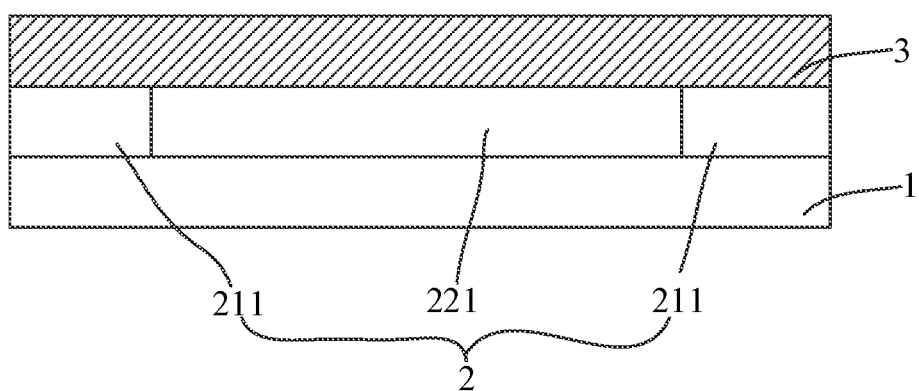
FIG. 9 is a schematic structural diagram of a flexible substrate according to a seventh embodiment of the present application.

FIG. 9 is a schematic structural diagram of a flexible substrate according to a seventh embodiment of the present application. As shown in FIG. 9, the flexible substrate according to the embodiment of the present application includes a first module material layer 1 and a second module material layer 3 stacked on the first module material layer 1, and at least one strain barrier layer 2 disposed between the first module material layer 1 and the second module material layer 3. The strain barrier layer 2 includes a chamber 221 and an elastic material layer 211 surrounding a periphery of the chamber.

The module material layers are functional units constituting the flexible substrate. Each module material layer may include a plurality of functional layers. For example, the module material layers may be a flexible display screen, a TP layer, a POL layer and so on. In order to distinguish different module material layers, the first and second qualifiers, such as the first module material layer 1 and the second module material layer 3, are introduced in the embodiment of the present application.

In the flexible substrate according to the embodiment of the application, the strain barrier layer 2 is disposed between the first module material layer 1 and the second module material layer 3. Since a strain between the first module material layer 1 and the second module material layer 3 may be effectively blocked by the strain barrier layer 2, transmission of the strain between the first module material layer 1 and the second module material layer 3 when occurring bending deformation may be effectively prevented. Therefore, the strain between the first module material layer 1 and the second module material layer 3 may be reduced, and thereby bending resistance of the flexible substrate is significantly improved and reliability of products is improved.

However, the flexible substrate is not limited to include only the first module material layer 1 and the second module material layer 3 shown in FIG. 9, and may also include a plurality of module material layers. The strain barrier layer 2 may be disposed between two adjacent module material layers. The number of layers of the module material layers and between which two adjacent module material layers provided with the strain barrier layer 2 are not specifically limited in the embodiment of the present application.

In an embodiment, the chamber 221 may be filled with a gas or may be in a vacuum state to isolate strain. However, when the chamber 221 is filled with the gas, air pressure inside and outside the chamber 221 may be balanced.

In an embodiment, the gas may be air or one or a mixture of inert gases. Since air resources are abundant and convenient to be collected, overall manufacturing cost of the flexible substrate may be reduced by filling air in the chamber 221. The gas may also be an inert gas. Since chemical properties of inert gas are stable and difficult to chemically react with contact substance, service life of the flexible substrate may be increased by setting inert gas in the chamber 221. However, the kind of gas in the chamber 221 is not specifically limited in the embodiment of the present application.

In addition, in a practical application scenario, the display panel 104 may need to be electrically connected to an external circuit structure through a conductive lead. The conductive lead may be formed by punching a hole in a surface (side surface, top surface or bottom surface) of the flexible glass layer 10, and then filling the hole with a conductive material. A gap between the conductive material in the hole and the hole may be sealed with a sealing material. Alternatively, a conductive film extending to an outer surface of the first flexible glass layer 101 may be plated on the side surface of the groove of the first flexible glass layer 101, and the conductive film is etched into a pattern of the conductive lead, and then the second flexible glass layer 102 and the first flexible glass layer 101 are encapsulated. However, the display panel 104 encapsulated in the flexible glass layer 10 may also form an electrical connection with the external circuit structure by other means, but a specific structure and specific formation manner of the conductive lead are not limited in the present application.

Figure 10:
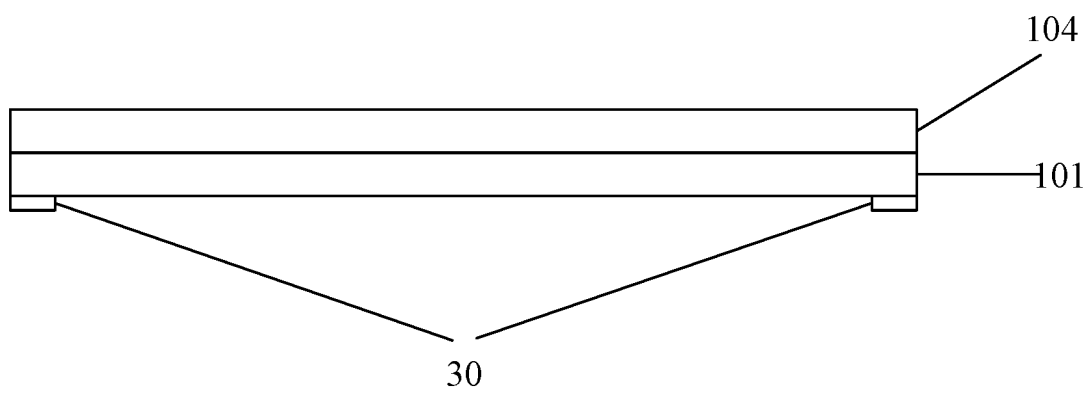
FIG. 10 is a schematic structural diagram of a flexible substrate according to an eighth embodiment of the present application.

FIG. 10 is a schematic structural diagram of a flexible substrate according to an eighth embodiment of the present application. As shown in FIG. 10, in addition to a first flexible glass layer 101, a second flexible glass layer 102, and a display panel 104 disposed on a first surface of the first flexible glass layer 101, the flexible substrate further includes a routing area 30 disposed on a second surface of the first flexible glass layer 101. The second surface is a surface opposite to the first surface. The routing area 30 is electrically connected to the display panel 104 disposed on the first surface.

In this embodiment, the first surface of the first flexible glass layer 101 is a front surface. A Thin Film Transistor (TFT) array layer, an anode layer, an organic light emitting layer, a cathode layer and so on may be sequentially disposed on the front surface. These functional layers collectively constitute the display panel 104 and become a display area of a display device. The second surface of the first flexible glass layer 101 is a back surface. The routing area 30 is disposed at a corresponding position on the back surface of the first flexible glass layer 101 as a non-display portion, such as a surrounding edge region. Therefore, a area of a non-display area on the front surface of the device is greatly reduced, and a display effect of narrow border or even full screen may be achieved by the device.

In the display device according to the embodiment, the routing area on the non-display portion is disposed on the back surface of the flexible substrate. The routing area is electrically connected to the OLED module on the front surface to perform a routing function. Therefore, the area of the non-display area on the front surface of the display device is greatly reduced, and the display effect of narrow border or even full screen is achieved by the device. Thereby, the display effect of the screen is enhanced and visual experience of users is improved.

In an embodiment of the application, a first flexible glass layer 101 includes a via hole. A circuit route of the routing area 30 may be connected to a display panel 104 on a front surface through the via hole on the first flexible glass layer 101. For example, multiple via holes may be set in one-to-one correspondence with multiple circuit routes. Alternatively, a via hole may be set to corresponds to multiple circuit routes, or a via hole may be set to corresponds to all circuit routes. The via hole may be formed by punching with laser or by a chemical manner. Wall of the via hole may be evaporated with various conductive media, such as copper. Thus, the circuit route of the routing area 30 on the back surface of the first flexible glass layer 101 may be electrically connected to the display panel 104 on the front surface through the via hole.

In an embodiment of the present application, when a final display product to be prepared needs to have a preset curved shape (for example, a 2.5D curved surface with a flat surface in the middle and a curved surface in the periphery, or a 3D curved surface with a curved surface in the middle and the periphery), a frame having the preset curved shape may be prepared, and then the flexible substrate according to the embodiments of the present application is installed into the frame. A perimeter of the frame may be smaller than a perimeter of the flexible substrate. Since the flexible substrate has a bendable property, the whole flexible substrate is curved from a flat surface into a curved surface when the whole flexible substrate is installed into the frame having a perimeter smaller than that of the whole flexible substrate.

In an embodiment, installing the flexible substrate into the frame may include: bonding the frame to circumference of the whole flexible substrate in a frame-fitting manner. In order to ensure a more secure installation between the flexible AMOLED panel and the flexible glass, an annular groove may be disposed on an inner surface of the frame.

Preferably, a depth of the annular groove is 3 mm to 5 mm. Therefore, the installation is ensured to be secure and the frame is not made too thick. A width of the annular groove may be equal to a thickness of the flexible substrate.

A cross-sectional shape of the annular groove may be any one of an U shape, an arc shape and a trapezoidal shape.

Figure 11:
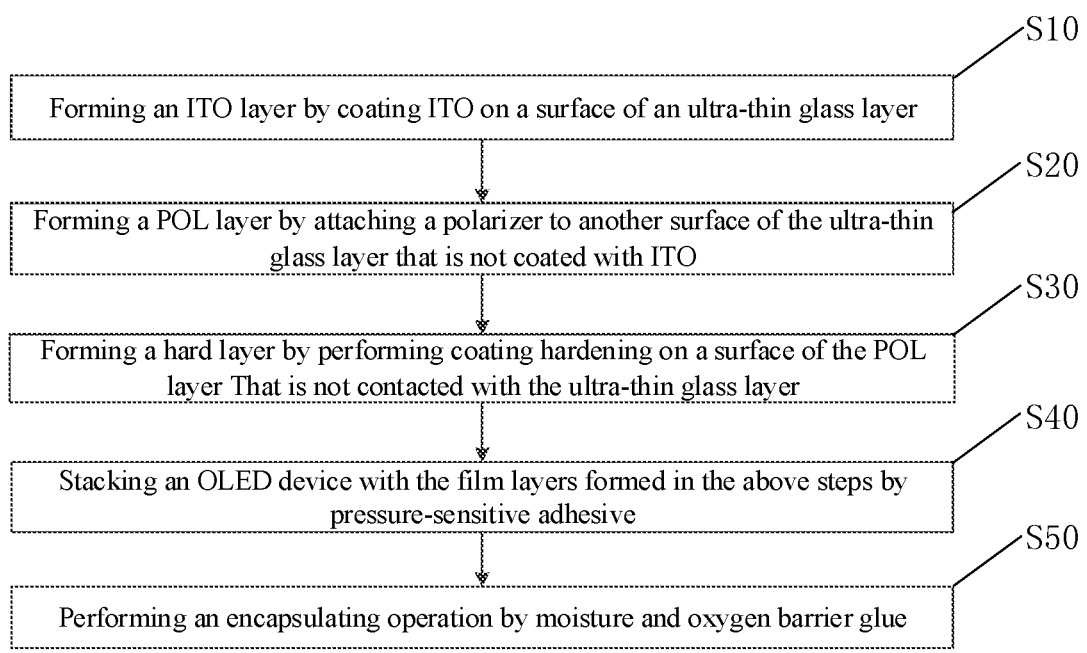
FIG. 11 is a schematic flow diagram of a manufacturing method of a flexible substrate according to a ninth embodiment of the present application.

FIG. 11 is a schematic flow diagram of a manufacturing method of a flexible substrate according to a ninth embodiment of the present application. As shown in FIG. 11, the manufacturing method of the flexible substrate according to the ninth embodiment of the present application includes the following steps.

Step S10: forming an ITO layer by coating ITO on a surface of an ultra-thin glass layer.

Step S20: forming a POL layer by attaching a polarizer to another surface of the ultra-thin glass layer without ITO coated.

Step S30: forming a hard layer by performing coating hardening on a surface of the POL layer that is not contacted with the ultra-thin glass layer.

Step S40: stacking an OLED device with the film layers formed in the above steps by pressure-sensitive adhesive.

The stacking operation in the step S40 includes, but is not limited to, an attaching operation or a coating operation. Therefore, adaptability of the embodiment of the present application is improved.

Step S50: performing an encapsulating operation by moisture and oxygen barrier glue.

In an actual application, firstly the ITO layer is formed by coating ITO on the surface of the ultra-thin glass layer, the POL layer is formed by attaching the polarizer to another surface of the ultra-thin glass layer without ITO coated, and then the hard layer is formed by performing the coating hardening on the surface of the POL layer that is not contacted with the ultra-thin glass layer, and finally the OLED device (an OLED layer and a backplane glue layer) is stacked with the film layers formed in the above steps by pressure sensitive adhesive, and the encapsulating operation is performed by moisture and oxygen barrier glue.

Figure 12:
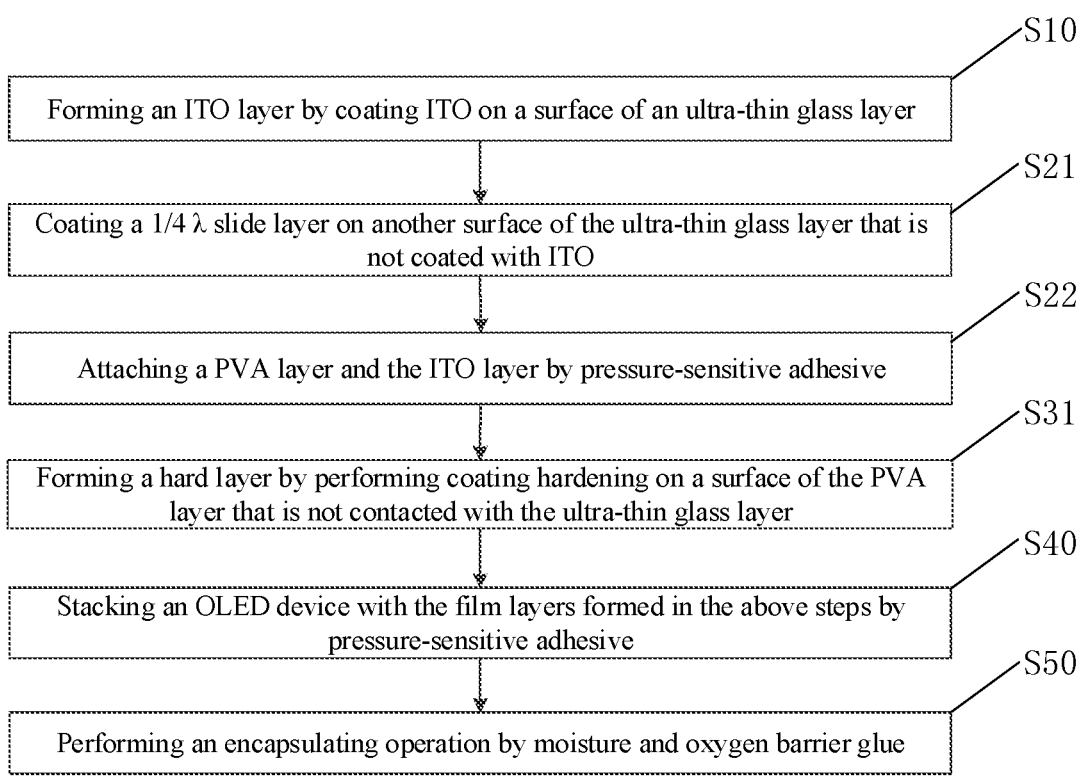
FIG. 12 is a schematic flow diagram of a manufacturing method of a flexible substrate according to a tenth embodiment of the present application.

FIG. 12 is a schematic flow diagram of a manufacturing method of a flexible substrate according to a tenth embodiment of the present application. The tenth embodiment of the present application is extended on the basis of the ninth embodiment of the present application. The tenth embodiment of the present application is substantially the same as the ninth embodiment of the present application. Differences will be described below, and similarities are not described again.

As shown in FIG. 12, in the manufacturing method of a flexible substrate according to the tenth embodiment of the present application, the step S20 mentioned in the manufacturing method of a flexible substrate according to the ninth embodiment is replaced with a step S21 and a step S22, and the step S30 is replaced with a step S31. Details are described below.

Step S21: coating a ¼ λ slide layer on another surface of the ultra-thin glass layer without ITO coated.

Step S22: attaching a PVA layer and the ITO layer by pressure-sensitive adhesive.

Step S31: forming a hard layer by performing coating hardening on a surface of the PVA layer that is not contacted with the ultra-thin glass layer.

In an actual application, firstly the ITO layer is formed by coating ITO on the surface of the ultra-thin glass layer, and then the ¼ λ slide layer is coated on another surface of the ultra-thin glass layer without ITO coated, the PVA layer and the ITO layer are attached by pressure-sensitive adhesive, and the hard layer is formed by performing coating hardening on the surface of the PVA layer that is not contacted with the ultra-thin glass layer, and finally an OLED device (an OLED layer and a backplane glue layer) is stacked with the film layers formed in the above steps by pressure sensitive adhesive, and an encapsulating operation is performed by moisture and oxygen barrier glue.

The ITO mentioned in the above embodiments may be replaced with another conductive material, and the ITO layer mentioned in the above embodiments may be replaced with another conductive layer.

In an embodiment of the application, a user terminal is further provided. The user terminal includes the flexible substrate described in any of the above embodiments. The user terminal includes, but is not limited to, a user terminal such as a mobile phone or a tablet computer.

The above embodiments are only the preferred embodiments of the present application and are not intended to limit the scope of the present application. Any modification, equivalent substitution, improvement, etc. made within the spirit and the scope of the present application are intended to be included within the scope of the present application.

What is claimed is:

1. A flexible substrate, comprising a hard layer, an organic functional layer and a backplane layer which are stacked; wherein
    the organic functional layer is attached to the backplane layer;
    the flexible substrate further comprises a Polarizer layer and a Touch Panel layer disposed between the hard layer and the organic functional layer, and
    the Touch Panel layer comprises a glass substrate and a conductive layer coated on a surface of the glass substrate;
    wherein the Polarizer layer comprises a Polyvinyl Alcohol layer and a ¼ λ slide layer, the ¼ λ slide layer is coated to a surface of the glass substrate of the Touch Panel layer without the conductive layer coated, and the Polyvinyl Alcohol layer is disposed between the glass substrate and the hard layer or between the glass substrate and the organic functional layer.

2. The flexible substrate of claim 1, wherein the glass substrate of the Touch Panel layer is directly contacted with the organic functional layer.

3. The flexible substrate of claim 1, wherein an adhesive layer is disposed between the glass substrate and the organic functional layer.

4. The flexible substrate of claim 3, wherein the hard layer comprises a hard coating layer disposed in a coating manner, the glass substrate of the Touch Panel layer comprises an ultra-thin glass layer, and the adhesive layer comprises a pressure-sensitive adhesive layer.

5. The flexible substrate of claim 1, further comprising an adhesive layer disposed between the conductive layer of the Touch Panel layer and the Polyvinyl Alcohol layer of the Polarizer layer.

6. The flexible substrate of claim 1, further comprising an adhesive layer disposed between the conductive layer of the Touch Panel layer and the organic functional layer.

7. The flexible substrate of claim 1, further comprising an encapsulation layer disposed on a periphery of a film layer included between the glass substrate of the Touch Panel layer and the organic functional layer.

8. The flexible substrate of claim 1, wherein the hard layer is disposed in an attaching manner or in a coating manner.

9. The flexible substrate of claim 1, wherein a thickness of the glass substrate of the Touch Panel layer is 25 μm to 70 μm.

10. The flexible substrate of claim 1, further comprising a first flexible glass layer and a second flexible glass layer stacked on the first flexible glass layer, and a sealing layer disposed between the first flexible glass layer and the second flexible glass layer, wherein an empty groove region is disposed in the sealing layer, and the hard layer, the organic functional layer and the backplane layer are disposed in the empty groove region.

11. The flexible substrate of claim 10, further comprising a first silicone oil layer disposed adjacent to the first flexible glass layer.

12. The flexible substrate of claim 10, further comprising a second silicone oil layer disposed adjacent to the second flexible glass layer.

13. A manufacturing method of a flexible substrate, comprising:
    forming a conductive layer by coating a conductive material on a surface of a glass substrate;
    disposing a Polarizer layer on a surface of the glass substrate without the conductive material coated;

forming a hard layer by performing coating hardening on a surface of the Polarizer layer not contacted with the glass substrate; and stacking the conductive layer, the Polarizer layer and the hard layer with an organic functional layer and a backplane layer which are stacked.

14. The manufacturing method of a flexible substrate of claim 13, further comprising preforming an encapsulating operation for a film layer between the glass substrate and the organic functional layer.

15. A manufacturing method of a flexible substrate, comprising:

forming a conductive layer by coating a conductive material on a surface of a glass layer;

coating a ¼ λ slide layer on another surface of the glass layer without the conductive material coated, and attaching a Polyvinyl Alcohol layer and the conductive layer;

forming a hard layer by performing coating hardening on a surface of the Polyvinyl Alcohol layer not contacted with the glass layer; and stacking the conductive layer, the Polyvinyl Alcohol layer and the hard layer with an organic functional layer and a backplane layer which are stacked.

16. The manufacturing method of a flexible substrate of claim 15, further comprising encapsulating a film layer between the glass layer and the organic functional layer.

* * * * *